(12) United States Patent
Jeon et al.

(10) Patent No.: US 7,193,452 B2
(45) Date of Patent: Mar. 20, 2007

(54) TEMPERATURE-COMPENSATED BIAS CIRCUIT FOR POWER AMPLIFIER

(76) Inventors: Moon-Suk Jeon, 101 ho, 98-1, Bongchon dong, Kwanak-gu, Seoul (KR); Sang Hwa Jung, Joogong APT 15 dong-401 ho, 532 Gojan-dong, Ansan, Kyunggi-Do (KR); Junghyun Kim, Woo-wul villa 403 ho, 178-76, Bongchon 11dong, Kwanak-gu, Seoul (KR)

( * ) Notice: Subject to any disclaimer, the term of this patent is extended or adjusted under 35 U.S.C. 154(b) by 8 days.

(21) Appl. No.: 10/905,660

(22) Filed: Jan. 14, 2005

(65) Prior Publication Data

US 2006/0077001 A1   Apr. 13, 2006

(30) Foreign Application Priority Data

Oct. 11, 2004   (KR) .................. 10-2004-0080840

(51) Int. Cl.
  *G05F 3/02* (2006.01)
  *H03F 3/04* (2006.01)
(52) U.S. Cl. ..................... 327/538; 330/289
(58) Field of Classification Search ........ 327/512–513, 327/538, 541–543, 545–546; 330/266–267, 330/272, 289
  See application file for complete search history.

(56) References Cited

U.S. PATENT DOCUMENTS

| | | | |
|---|---|---|---|
| 3,944,874 A * | 3/1976 | Murley, Jr. .................. | 345/69 |
| 4,924,194 A * | 5/1990 | Opas et al. .................. | 330/289 |
| 5,152,004 A | 9/1992 | Väisänen et al. | |
| 5,175,851 A | 12/1992 | Johnson et al. | |
| 5,276,912 A | 1/1994 | Siwiak et al. | |
| 5,530,923 A | 6/1996 | Heinonen et al. | |
| 5,661,434 A | 8/1997 | Brozovich et al. | |
| 5,758,269 A | 5/1998 | Wu | |
| 5,909,643 A | 6/1999 | Aihara | |
| 6,060,949 A | 5/2000 | Kaufman et al. | |
| 6,069,526 A | 5/2000 | Ballantyne | |
| 6,130,589 A | 10/2000 | Yamaguchi et al. | |

(Continued)

FOREIGN PATENT DOCUMENTS

CN    1324143    11/2001

(Continued)

*Primary Examiner*—My-Trang Nu Ton
(74) *Attorney, Agent, or Firm*—Townsend and Townsend and Crew LLP

(57) ABSTRACT

Provided is a temperature-compensated bias circuit for a power amplifier, in which a first resistor (Rref) connected to a reference voltage is connected to a base terminal of a third transistor (Q3) and an emitter terminal of the third transistor is connected to a first diode (D1). The temperature-compensated bias circuit includes a second resistor (R1) connected to the reference voltage, a third resistor (R2) connected to the second resistor in series, a fourth resistor (Rc) having one terminal connected to the reference voltage, a fifth resistor (Re) having one terminal connected to ground, a bias transistor (Q4) having a base terminal connected to a contact point (VS) between the second resistor and the third resistor, a collector terminal connected to the other terminal of the fourth resistor, and an emitter terminal connected to the other terminal of the fifth resistor, and a sixth resistor (Rf) connected between a collector terminal of the third transistor and a collector terminal of the bias transistor.

12 Claims, 8 Drawing Sheets

U.S. PATENT DOCUMENTS

| | | |
|---|---|---|
| 6,205,318 B1 | 3/2001 | Schindler et al. |
| 6,356,150 B1 | 3/2002 | Spears et al. |
| 6,363,685 B1 | 4/2002 | Kugler |
| 6,374,116 B1 | 4/2002 | Peterzell et al. |
| 6,487,419 B1 | 11/2002 | Freed |
| 6,556,082 B1 * | 4/2003 | Wang et al. ............ 330/288 |
| 6,603,359 B2 | 8/2003 | Fujiwara et al. |
| 6,674,323 B2 | 1/2004 | Kagaya et al. |
| 6,700,439 B2 | 3/2004 | Jackson |
| 6,781,455 B2 | 8/2004 | Kim |
| 6,806,775 B2 * | 10/2004 | Abe ...................... 330/297 |
| 6,809,587 B2 | 10/2004 | Ghannouchi et al. |
| 6,992,524 B2 * | 1/2006 | Yang et al. ............ 327/540 |
| 2006/0055447 A1 * | 3/2006 | Jeon et al. ............ 327/513 |
| 2006/0077001 A1 | 4/2006 | Jeon et al. |

FOREIGN PATENT DOCUMENTS

| | | |
|---|---|---|
| DE | 10102891 | 11/2001 |
| JP | 2001326537 | 11/2001 |
| KR | 20010105151 | 11/2001 |
| TW | 507427 | 10/2002 |

* cited by examiner

△—△ case in which a temperature compensation function does not exit

○—○ case in which a temperature is compensated with respect to a high temperature(mode2)

□--□ case in which a temperature is compensated with respect to the room temperature(mode1)

●--● case in which a temperature is compensated with respect to a low temperature(mode3)

US 7,193,452 B2

TEMPERATURE-COMPENSATED BIAS CIRCUIT FOR POWER AMPLIFIER

DESCRIPTION

This application claims priority under 35 U.S.C. § 119 to Korean patent application number 10-2004-0080840, filed Oct. 11, 2004, which is incorporated by reference along with all other references cited in this application.

BACKGROUND OF THE INVENTION

1. Field of the Invention

The present invention relates to a power amplifier included in a personal portable communication device such as a cellular phone or a personal digital assistant (PDA), and more particularly, to a temperature-compensated bias circuit for a power amplifier.

2. Description of the Related Art

With the development of electronic technologies, portable electronic apparatuses are efficiently designed and costly effectively manufactured. The portable electronic apparatuses largely include pagers, cellular phones, music players, calculators, laptop computers, and PDAs. The portable electronic apparatuses generally require DC power and one or more batteries are used as an energy source for supplying DC power.

Wireless portable communication terminals such as mobile handsets or cellular phones are becoming compact and light. Accordingly, the size of a battery occupying a considerable portion of the mobile handset is becoming smaller to fit into the mobile handset that is compact and light. In case of the cellular phone, along with smaller terminal and battery, longer talk time is required. Thus, the life of the battery is an important factor in the mobile communication terminals such as mobile handsets or cellular phones.

The temperature in use of these personal wireless communication apparatuses changes according to a change of a season, the operation of an amplifier, or an operation duration time. Maintaining a particular feature of a power amplifier in spite of the change in temperature is another important factor in determining performance of the terminal.

A bias circuit to compensate for a temperature is needed for a superior amplification operation of a power amplifier in an appropriate operation range in spite of the change in temperature. According to a conventional technology, a circuit as shown in FIG. 1 is used for the bias of a power amplifier.

FIG. 1 is a circuit diagram of a bias circuit of a conventional power amplifier. Referring to FIG. 1, a transistor Q2 is a simplified form of an amplification end of a power amplifier. A transistor Q1 is a bias transistor, or a DC buffer transistor, which provides a bias voltage to a base of the transistor Q2. Since the transistor Q1 compensates for insufficient current applied to the transistor Q2 when a bias voltage $V_y$ is directly input to the base of the transistor Q2, it is referred to as a DC buffer transistor. In FIG. 1, a power voltage Vcc is applied to the transistors Q2 and Q1 while a reference voltage Vref is applied to a resistor Rref of a bias circuit block 200. A collector static operational current of the transistor Q2 is indicated by static operational current $I_Q$.

Prior to the description of the conventional invention, the typical current characteristic of a diode needs to be understood. Those skilled in the art would easily understand that the current characteristic of a typical diode is identical to that according to a base-emitter voltage of a transistor.

FIG. 2 is a graph showing that the characteristic of current according to a voltage between both ends of a diode or the characteristic of current according to the base-emitter voltage of a transistor, with a parameter of temperature. In FIG. 2, as the temperature increases, a characteristic curve moves to the left so that a diode turn-on voltage $V_{BE}$(on) decreases. As it is well known, the movement of the curve has a value of about $-2mV/°C$. When the bias voltage Vbias is constant, the effective base-emitter voltage is that $V_{BE}(\text{eff})=\text{Vbias}-V_{BE}(\text{on})$ so that the current increases.

Next, in the temperature compensation operation of the conventional bias circuit block 200 of FIG. 1, it is assumed that a voltage of a $V_y$ node is designed to be 2.6 V by the resistor Rref and two diodes D1 and D2 at the room temperature of about 25° C. This means that a value of the resistor Rref is set such that the voltage between both ends of each of the two diodes connected in series becomes 1.3 V.

The voltage between the base-emitter of the transistors Q1 and Q2 is 1.3 V like the diodes D1 and D2.

When an operation temperature increases, in the transistors Q1 and Q2, as shown in FIG. 2, the base-emitter turn-on voltage $V_{BE}$(on) decreases so that the static operational current $I_Q$ increases. However, since the diodes D1 and D2 have the same temperature dependency as the transistors Q1 and Q2, the voltage $V_y$ decreases accordingly. The decrease of the voltage $V_y$ means a decrease in the base-emitter voltage of the transistors Q1 and Q2. Also, since the effective voltage $V_{BE}$(eff) between the base-emitter voltage of the transistors Q1 and Q2 does not change, the static operational current $I_Q$ is constant.

When the operation temperature decreases, the base-emitter turn-on voltage $V_{BE}$(on) of in the transistors Q1 and Q2 increases so that the static operational current $I_Q$ decreases. However, since the diodes D1 and D2 have the same temperature dependency as the transistors Q1 and Q2, the voltage $V_y$ increases accordingly. The increase of the voltage $V_y$ means an increase in the base voltage of the transistors Q1 and Q2. Also, since the effective voltage $V_{BE}$(eff) between the base-emitter voltage of the transistors Q1 and Q2 does not change, the static operational current $I_Q$ is constant.

To summarize the above operation, the voltage $V_y$ between both ends of each of the diodes D1 and D2 tracks the base-emitter turn-on voltage of the transistors Q1 and Q2 according to the change in temperature so that the effective voltage $V_{BE}$(eff) is constantly maintained. Thus, in spite of the change in temperature, the static operational current $I_Q$ is contact.

However, practically, when the $V_y$ voltage drops to about 2.4 V, the voltage between both ends of the base-emitter of each of the transistors Q1 and Q2 automatically decreases to about 1.2 V. However, in this case, the static operational current $I_Q$ of the transistor Q2 increases greater than the size at the room temperature. This is because the sizes of the transistors Q1 and Q2 driving a large amount of current are much greater than those of the diodes D1 and D2 so that the dependency on temperature is not the same. Thus, it is a problem that the voltage $V_y$ must be less than 2.4 V to perform accurate temperature compensation so that the static operational current $I_Q$ of the transistor Q2 is constantly maintained.

When the operation temperature drops lower than the room temperature, the voltage $V_y$ increases by the temperature dependency intrinsic to the diodes D1 and D2. When the voltage $V_y$ increases to about 2.8 V, the voltage between both ends of the base-emitter of each of the transistors Q1 and Q2 automatically increases to about 1.4 V. Accordingly, the static operational current $I_Q$ of the transistor Q2 decreases compared to the current at the room temperature. For the same reason in a case in which the temperature increases, in order to perform accurate temperature compensation by which the static operational current $I_Q$ of the transistor Q2 is constantly maintained, a problem in which the voltage $V_y$ must be greater than the static operational current $I_Q$ occurs. FIG. 3 is a graph showing the static operational current $I_Q$ when the temperature compensation function is insufficient due to the above problem in comparison with the static operational current $I_Q$ in an ideal state.

A variety of circuit techniques have been developed to solve a problem in which maintaining the static operational current $I_Q$ of the transistor Q2 constantly by the temperature compensation function based on the temperature dependency of the diodes D1 and D2 is difficult. One of the circuit techniques is that the voltage between both ends of each of the diodes D1 and D2 connected in series is arbitrarily and appropriately changed according to a change in temperature to provide a more ideal static operational current $I_Q$ feature.

Referring to FIG. 4, one of the conventional techniques having an additional temperature compensation function is described. This circuit includes a bias circuit block 200 and an amplifier block 210. In the configuration of the circuit, a transistor 226 shows part of an amplification circuit amplifying an RF signal and a transistor 224 is a DC buffer transistor and a resistor R2 DC-biases a base of the transistor 226.

The bias circuit block 200 has the same elements as the amplifier block 210 to form a current mirror shape. A transistor 220 and a transistor 222 make mirrored pairs with the transistor 224 and the transistor 226, respectively, while a resistor R1 makes a mirrored pair with the resistor R2.

A voltage of a node 234 flows from a base of the transistor 220 via the transistor 222 to ground so that a voltage drop is $2V_{BE}$. The resistor R1 is connected to a base node 240 of the transistor 222. A DC reference voltage Vref is connected to one side of a resistor Rref and current flowing between both ends of the resistor Rref is Iref.

When the operation temperature increases, the base-emitter turn-on voltage $V_{BE}(on)$ of the transistor 222 decreases. However, since current Imir is almost constantly maintained, the voltage of the node 240 is almost constantly maintained. Thus, an effective voltage between the base-emitter of the transistor 222 increases so that collector current of the transistor 222 increases and the voltage of the node 234 drops. When the voltage of the node 234 drops, the voltage of a node 242 drops automatically. Thus, since the effective voltage between the base-emitter of the transistor 226 is constant, a change in the static operational current $I_Q$ is restricted.

When the operation temperature decreases, the base-emitter turn-on voltage $V_{BE}(on)$ of the transistor 222 increases. However, since the current Imir is almost constantly maintained, the voltage of the node 240 is almost constantly maintained. Thus, the effective voltage between the base-emitter of the transistor 222 decreases so that the collector current of the transistor 222 decreases and the voltage of the node 234 increases. When the voltage of the node 234 increases, the voltage of a node 242 increases automatically. Thus, since the effective voltage between the base-emitter of the transistor 226 is constant, a change in the static operational current $I_Q$ is restricted.

In addition, as a conventional technology to finely adjust a voltage applied to diodes of a bias circuit, U.S. Pat. No. 6,566,954 describes an additional compensation function to a temperature compensation function of a bias circuit in which an active device instead of a resistor is inserted in a transistor amplifying an RF signal.

U.S. Pat. No. 6,452,454 describes a technology of an additional temperature compensation function by additionally providing a plurality of diodes in parallel or current paths in the bias circuit to adjust the amount of current flowing from the reference voltage Vref.

U.S. Pat. No. 6,556,082 describes another circuit technology enabling additional temperature compensation function, which is achieved by adding resistors and adjusting ratio between the resistors.

U.S. Pat. No. 6,424,225 describes a technology in which additional circuits are provided to operate according to a change in temperature so that reference current supplied from the bias circuit can be increased or decreased, thus enabling additional temperature compensation in a wider range.

SUMMARY OF THE INVENTION

To solve the above problems, the present invention provides a temperature-compensated bias circuit for a power amplifier having a circuit to compensate for a temperature by controlling a voltage of a bias circuit for the compensation of a temperature of the power amplifier.

According to an aspect of the present invention, a temperature-compensated bias circuit for a power amplifier, in which a first resistor (Rref) connected to a reference voltage is connected to a base terminal of a third transistor (Q3) and an emitter terminal of the third transistor is connected to a first diode (D1), the temperature-compensated bias circuit comprising: a second resistor (R1) connected to the reference voltage; a third resistor (R2) connected to the second resistor in series; a fourth resistor (Rc) having one terminal connected to the reference voltage; a fifth resistor (Re) having one terminal connected to ground; a bias transistor (Q4) having a base terminal connected to a contact point (Vs) between the second resistor and the third resistor, a collector terminal connected to the other terminal of the fourth resistor, and an emitter terminal connected to the other terminal of the fifth resistor; and a sixth resistor (Rf) connected between a collector terminal of the third transistor and a collector terminal of the bias transistor.

According to another aspect of the present invention, a temperature-compensated bias circuit for a power amplifier, in which a first resistor (Rref) connected to a reference voltage is connected to a base terminal of a third transistor (Q3) and an emitter terminal of the third transistor is connected to a first diode (D1), the temperature-compensated bias circuit comprising: a second diode (D2) connected to the reference voltage; a second resistor (R1) connected to the second diode;a third resistor (R2) connected to the second resistor in series; a fourth resistor (Rc) having one terminal connected to the reference voltage; a fifth resistor (Re) having one terminal connected to ground; a bias transistor (Q4) having a base terminal connected to a contact point (Vs) between the second resistor and the third resistor, a collector terminal connected to the other terminal of the fourth resistor, and an emitter terminal connected to the other terminal of the fifth resistor; and a sixth resistor (Rf) connected between a collector terminal of the third transistor and the collector terminal of the bias transistor.

According to another aspect of the present invention, a temperature-compensated bias circuit for a power amplifier, in which a first resistor (Rref) connected to a reference voltage is connected to a base terminal of a third transistor (Q3) and an emitter terminal of the third transistor is connected to a first diode (D1), the temperature-compensated bias circuit comprising: a second resistor (R1) connected to the reference voltage; a third resistor (R2) connected to the second resistor in series; a sixth resistor (Re) having one terminal connected to ground; a bias transistor (Q4) having a base terminal connected to a contact point (Vs) between the second resistor and the third resistor and an emitter terminal connected to the other terminal of the sixth resistor; and a seventh resistor (Rf) connected between a collector terminal of the third transistor Q3 and a collector terminal of the bias transistor.

According to another aspect of the present invention, a temperature-compensated bias circuit for a power amplifier, in which a first resistor (Rref) connected to a reference voltage is connected to a base terminal of a third transistor (Q3) and an emitter terminal of the third transistor is connected to a first diode (D1), the temperature-compensated bias circuit comprising: a second diode (D2) connected to the reference voltage; a second resistor (R1) connected to the second diode; a third resistor (R2) connected to the second resistor in series; a sixth resistor (Re) having one terminal connected to ground; a bias transistor (Q4) having a base terminal connected to a contact point (Vs) between the second resistor and the third resistor and an emitter terminal connected to the other terminal of the sixth resistor; and a seventh resistor (Rf) connected between a collector terminal of the third transistor Q3 and a collector terminal of the bias transistor.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
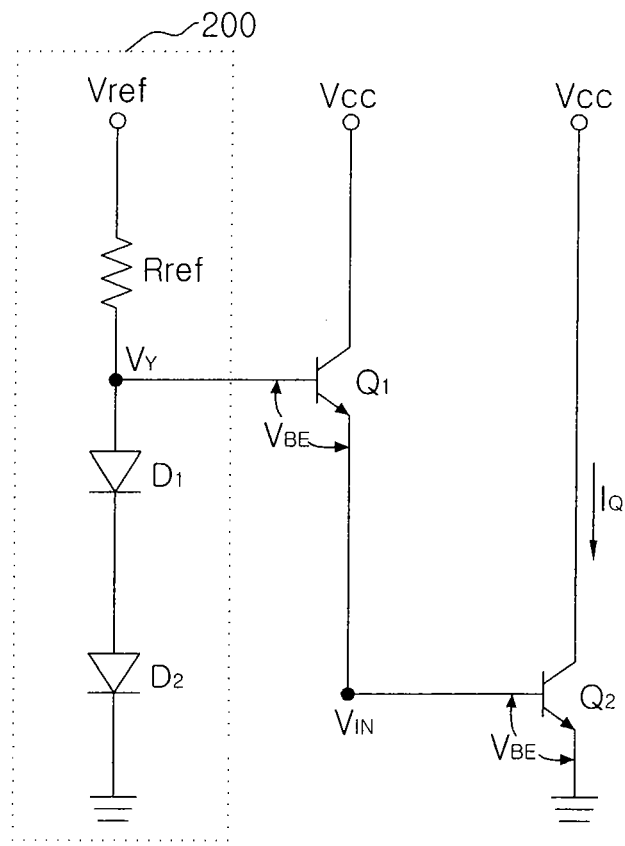
FIG. 1 is a circuit diagram of a conventional bias circuit of a power amplifier.
Figure 2:
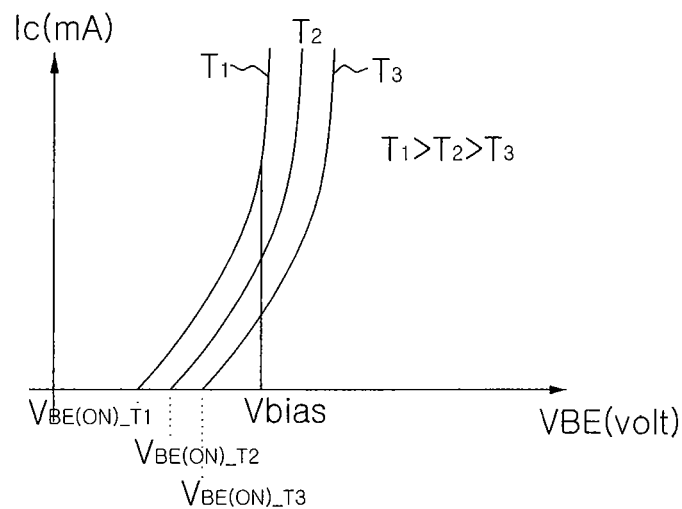
FIG. 2 is a graph showing the relationship between the base-emitter voltage and the current of a diode or a transistor.
Figure 3:
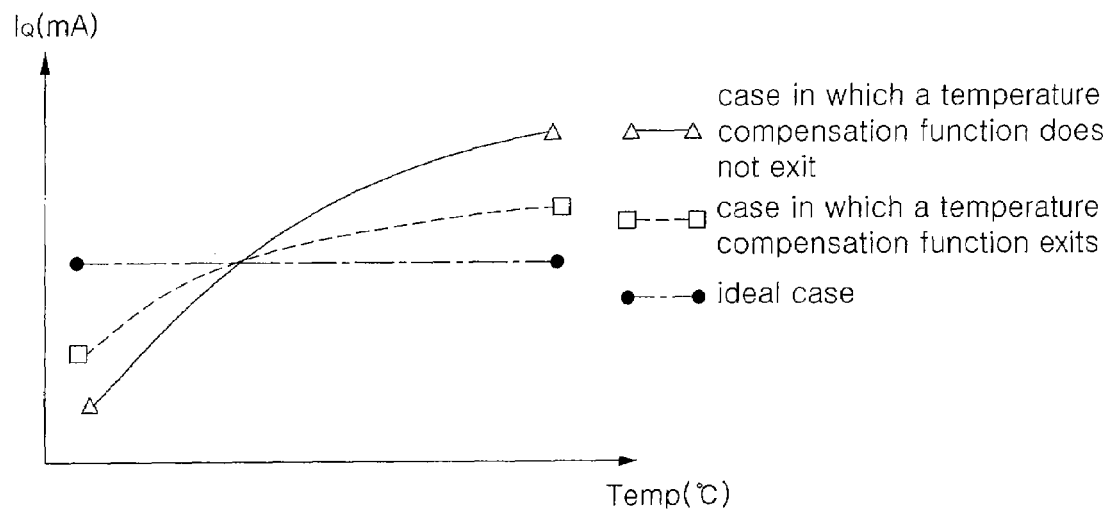
FIG. 3 is a graph showing the result of comparison between the static operational current $I_Q$ when the temperature compensation capability is insufficient and the static operational current $I_Q$ in an ideal state.
Figure 4:
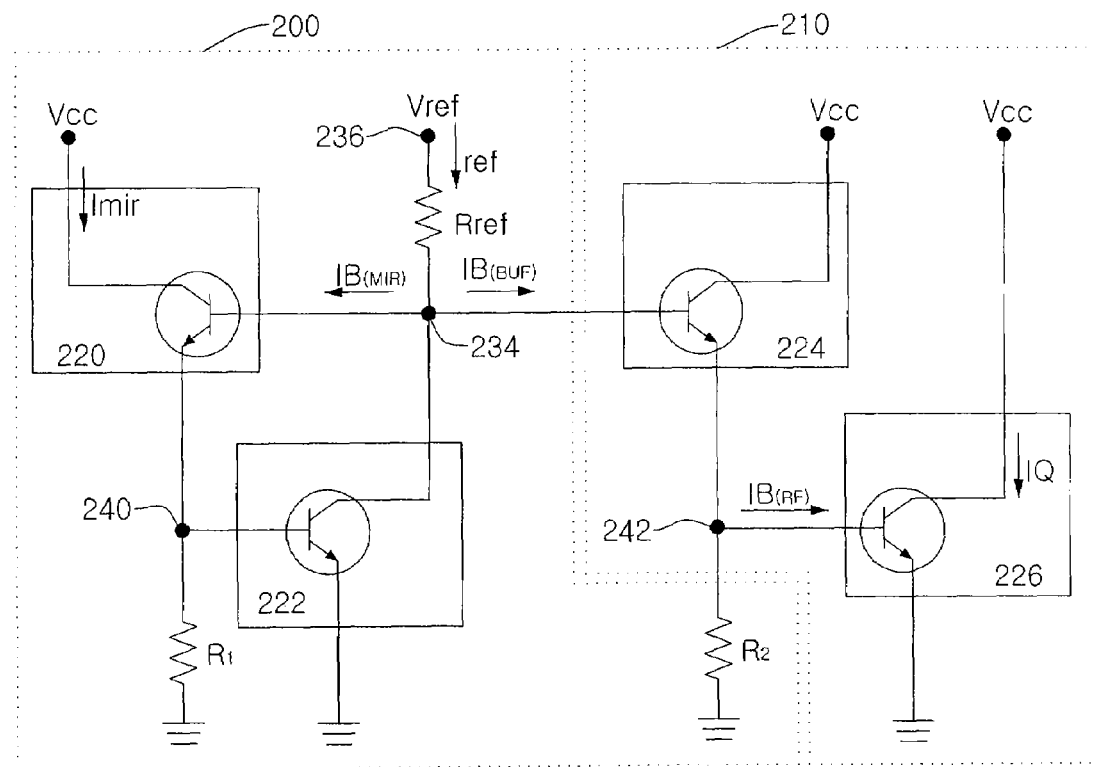
FIG. 4 is a circuit diagram of a conventional bias circuit of a power amplifier having an additional temperature compensation function.
Figure 5:
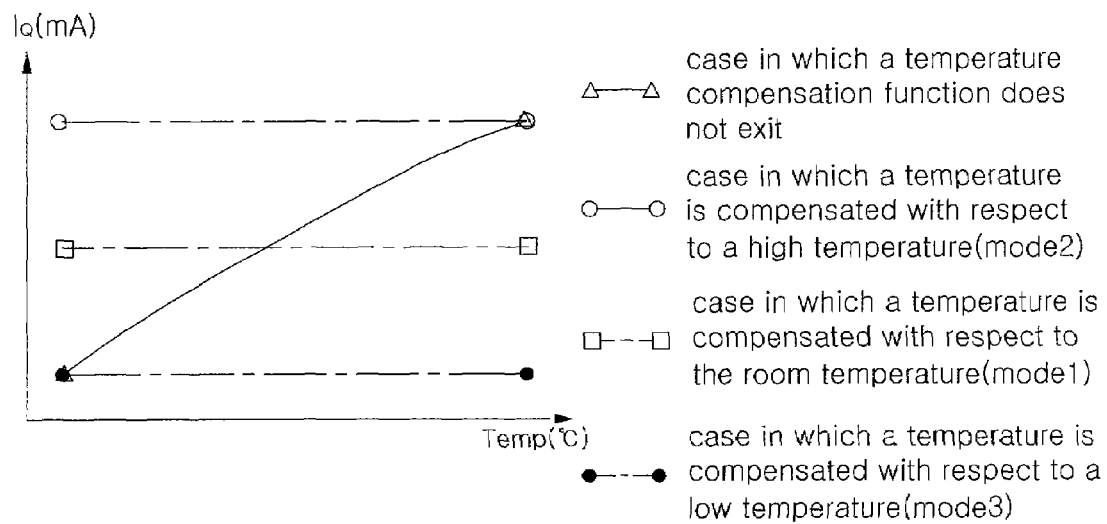
FIG. 5 is a graph showing the static operational current $I_Q$ of a bias circuit according to an embodiment of the present invention.

In the present invention, the additional temperature compensation in a wider range is possible, as shown in FIG. 5, by designing a circuit which operates to absorb reference current when temperature increases and source reference current when temperature decreases.

The present invention includes methods of maintaining a value of the static operational current $I_Q$ at the room temperature as shown in a curve shown in FIG. 5 (Mode 1), maintaining the value of the static operational current $I_Q$ at the highest temperature within a range allowed by the specification (Mode 2), and continuously maintaining the value of the static operational current $I_Q$ at the lowest temperature within the range allowed by the specification (Mode 3).

In Mode1, current at a lower/higher temperature with respect to the room temperature is up/down. In Mode 2, current at a relatively lower temperature with respect to a higher temperature is up. In Mode 3, current at a relatively higher temperature with respect to a lower temperature is down.

Figure 6:
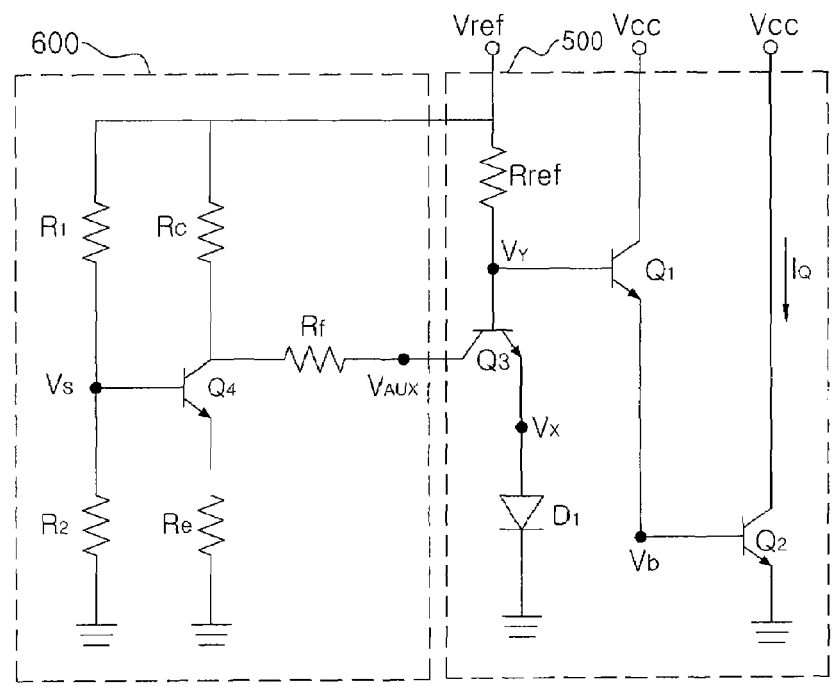
FIG. 6 is a circuit diagram of a temperature-compensated bias circuit for a power amplifier according to an embodiment of the present invention.

FIG. 6 is a circuit diagram of a temperature-compensated bias circuit for a power amplifier according to an embodiment of the present invention.

In a power amplifier block and a bias circuit block 500, a first transistor Q1 performs DC-buffering according to an input signal. The emitter terminal of the first transistor Q1 is connected to the base terminal of a second transistor Q2. A voltage Vcc is applied to the first and second transistors Q1 and Q2. A first resistor Rref receiving a reference voltage Vref and applying a bias voltage is connected to the base terminal of the third transistor Q3. A contact point $V_y$ between the first resistor Rref and the base terminal of the third transistor Q3 is connected to the base terminal of the first transistor Q1. Also, a first diode D1 is connected to the emitter terminal of the third transistor Q3.

In a temperature-compensated circuit 600 that is a voltage control bias circuit, a contact point $V_s$ between voltage dividing resistors R1 and R2 is connected to the base of a fourth transistor Q4. A collector resistor Rc is connected to the collector of the fourth transistor Q4. An emitter resistor Re is connected to the emitter of the fourth transistor Q4. A sixth resistor Rf is connected between the collector terminal of the third transistor Q3 and the collector output terminal of the fourth resistor Q4.

The operation of the temperature-compensated bias circuit for a power amplifier configured as shown in FIG. 6 is described based on operation modes 1, 2, and 3 according to a change in temperature.

(1) Operation Mode 1: Supply+Absorption Mode

First, when the temperature of the circuit is high with respect to the room temperature, since a decrease in the turn-on voltage of the second transistor Q2 is remarkable compared to a decrease in the voltage $V_y$ input to the base of the first transistor Q1 and a voltage $V_b$ input to the base of the second transistor Q2, the static operational current $I_Q$ increases. To restrict the increase in the static operational current $I_Q$ at the high temperature, the following operation occurs in the voltage control circuit 600.

If the contact point voltage Vs between the resistors R1 and R2 is constant regardless of the temperature, since the turn-on voltage of the fourth transistor Q4 decreases, the collector current of the fourth transistor Q4 increases so that a voltage drop at the collector resistor Rc increases much.

The contact point voltage $V_{AUX}$ between the sixth resistor Rf and the collector terminal of the third transistor Q3 decreases.

Accordingly, as the fourth transistor allows more amount of current to flow in and a BC junction diode of the third transistor Q3 is operated, the voltages $V_y$ and $V_b$ decrease, the increase in the static operational current $I_Q$ at a high temperature is restricted. That is, when the temperature is relatively higher than the room temperature, the temperature-compensated circuit 600 absorbs part of the reference current Iref.

Second, when the temperature of the circuit is low and the contact point voltage Vs between the resistors R1 and R2 is constant, the turn-on voltage of the fourth transistor Q4 increases and the collector current of the fourth transistor Q4 decreases so that a voltage drop at the collector resistor Rc decreases. The contact point voltage $V_{AUX}$ between the sixth resistor Rf and the collector terminal of the fourth transistor Q4 increases.

Accordingly, the current flows into the transistor Q2/the diode D1 through the resistor Rf so that the voltages $V_x$, $V_y$, and $Y_b$ increase the increase so that the static operational current $I_Q$ at a lower temperature is restricted.

(2) Operation Mode 2: Supply Mode

The temperature in all ranges in which the circuit operates may be lower than the maximum temperature allowed by the specification. Since the contact point voltage Vs between the resistors R1 and R2 is constant at a relatively low temperature, the turn-on voltage of the fourth transistor Q4 increases and the collector current of the fourth transistor Q4 decreases. Thus, the contact point voltage $V_{AUX}$ between the sixth resistor Rf and the collector terminal of the third transistor Q3 increases.

As the temperature decreases, the current flowing into the third transistor Q3/the diode D1 via the resistor $R_f(I_x>0)$. Accordingly, the voltages $V_x$, $V_y$, and $V_b$ increase. Thus, the static operational current $I_Q$ to be decreased as the temperature decreases is maintained.

(3) Operation Mode 3: Absorption Mode

The temperature in all ranges in which the circuit operates may be higher than the minimum temperature allowed by the specification. Since the contact point voltage Vs between the resistors R1 and R2 is constant when the temperature is relatively high, the turn-on voltage of the fourth transistor Q4 decreases and the collector current of the fourth transistor Q4 increases. Thus, the contact point voltage $V_{AUX}$ between the resistor Rf and the collector terminal of the third transistor Q3 decreases.

That is, as the temperature increases, the transistor Q4 allows more amount of current to flow in and the BC junction diode of the third transistor Q3 operates so that the voltages $V_y$ and $V_b$ decrease. Thus, the static operational current $I_Q$ to be increased as the temperature increases is maintained.

Another function of the present invention is to constantly maintain the static operational current of a power amplifier regardless a change in the reference voltage Vref. The reference voltage Vref is an item included in the specification of a typical cellular phone and variation thereof to a degree is allowed. When the reference voltage Vref increases or decreases, the operational characteristic of the circuit shown in FIG. 6 is as follows.

First, when the reference voltage Vref increases, the contact point voltage Vs increases so that an increase in the voltage $V_y$ is prevented.

Second, when the reference voltage Vref decreases, the contact point voltage Vs decreases so that, since the circuit operates like a low temperature-compensated bias circuit, a decrease in the voltage $V_y$ is prevented.

Thus, the change of the characteristic of the power amplifier is reduced regardless of the increase and decrease of the reference voltage Vref.

Figure 7:
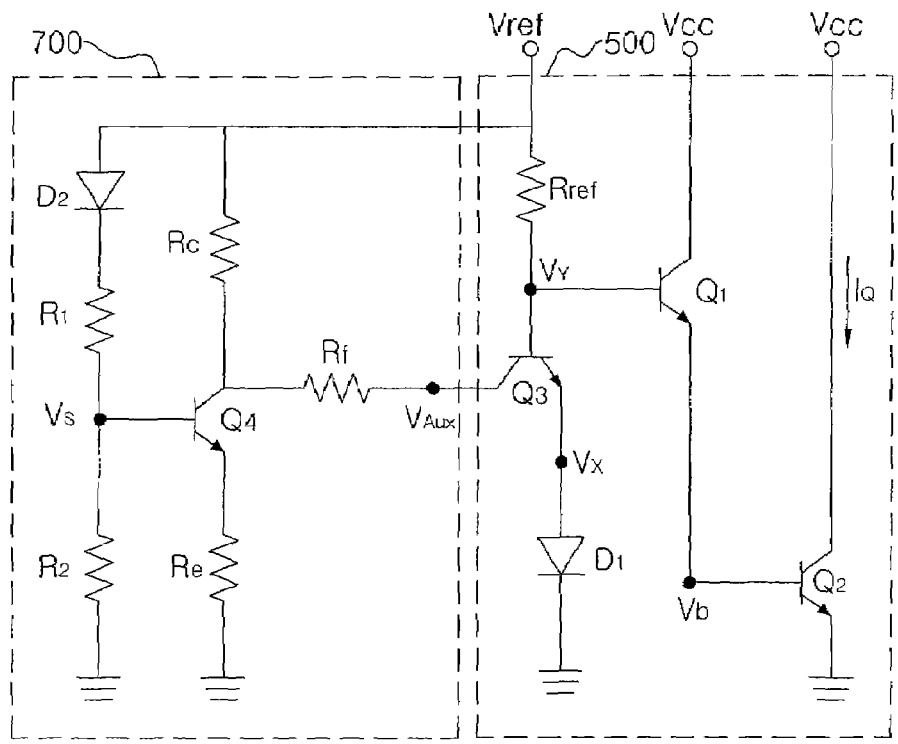
FIG. 7 is a circuit diagram of a temperature-compensated bias circuit for a power amplifier according to another embodiment of the present invention.

FIG. 7 is a circuit diagram of a temperature-compensated bias circuit for a power amplifier according to another embodiment of the present invention. Referring to FIG. 7, in a temperature-compensated circuit 700, as a diode D2 is added at a front or rear end of the voltage dividing resistor R1 at the temperature-compensated circuit 600 of FIG. 6, the voltage Vs changes according to the temperature. The voltages $V_x$ and $V_y$ are changed so that the compensation of a temperature becomes smooth.

Thus, In the circuit 700 shown in FIG. 7, the voltage Vs increases at a high temperature so that the voltage $V_y$ is further decreased. The voltage Vs decreases at a low temperature so that the voltage $V_y$ is further increased.

Figure 8:
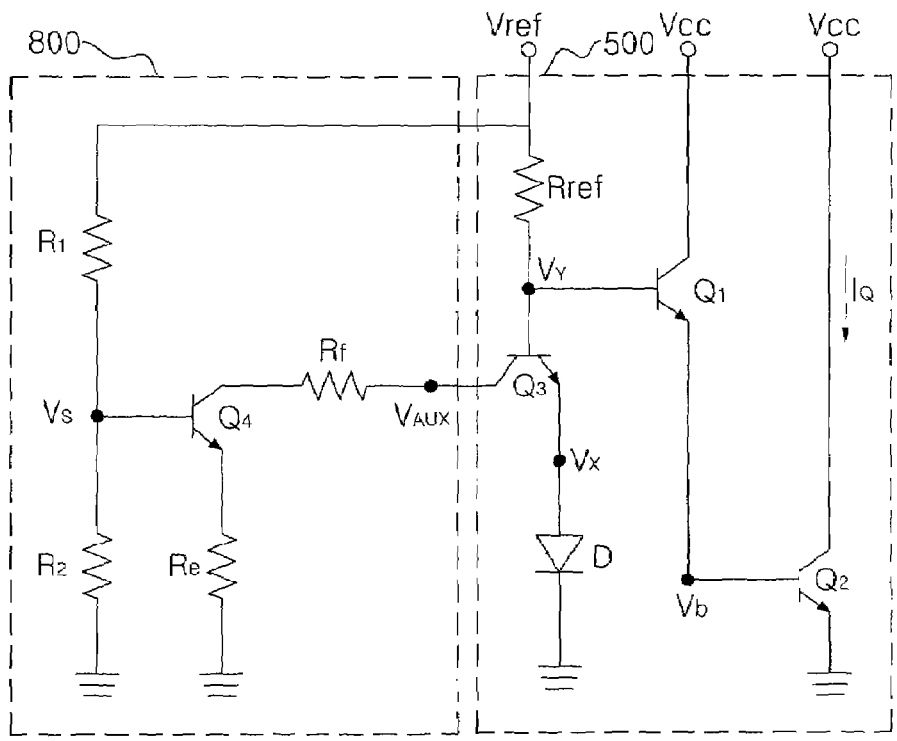
FIG. 8 is a circuit diagram of a temperature-compensated bias circuit for a power amplifier according to yet another embodiment of the present invention.

FIG. 8 is a circuit diagram of a temperature-compensated bias circuit for a power amplifier according to yet another embodiment of the present invention. Referring to FIG. 8, a temperature-compensated circuit 800, in which the collector resistor Rc is removed from the temperature-compensated circuit 600 in FIG. 6, can perform temperature compensation only by the absorption of current by the fourth transistor Q4. The operation principle of the temperature-compensated circuit 800 is the same as that of the operation mode 3 of FIG. 6 (Absorption Mode).

Figure 9:
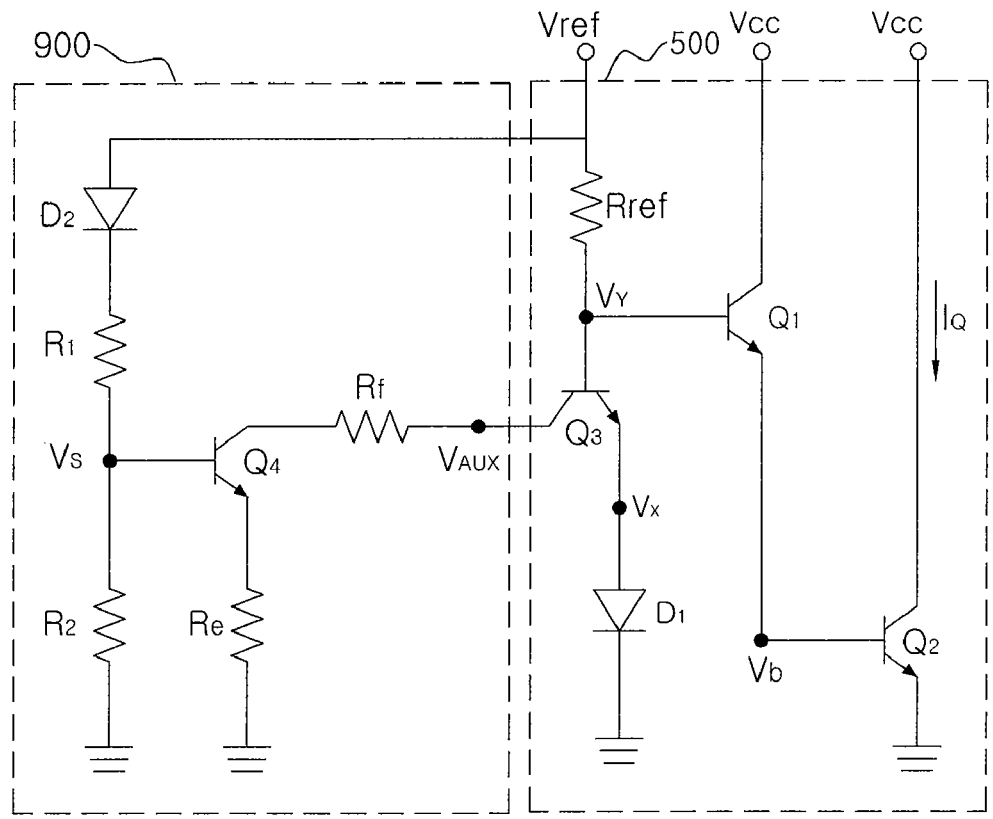
FIG. 9 is a circuit diagram of a temperature-compensated bias circuit for a power amplifier according to still yet another embodiment of the present invention.

FIG. 9 is a circuit diagram of a temperature-compensated bias circuit for a power amplifier according to still yet another embodiment of the present invention. Referring to FIG. 9, a temperature-compensated circuit 900, in which the diode D2 is added at the front or read end of the voltage dividing resistor R1 in the temperature-compensated circuit 700 in FIG. 7, the voltage Vs changes according to the temperature. The voltages $V_x$ and $V_y$ are changed so that the compensation of a temperature becomes smooth. The operation principle of the temperature-compensated circuit 900 is the same as that of the operation mode 3 of FIG. 7 (Absorption Mode)

FIGS. 10 through 12 are graphs showing the operation modes of the temperature-compensated bias circuit for a power amplifier according to the present invention.

Figure 10A:
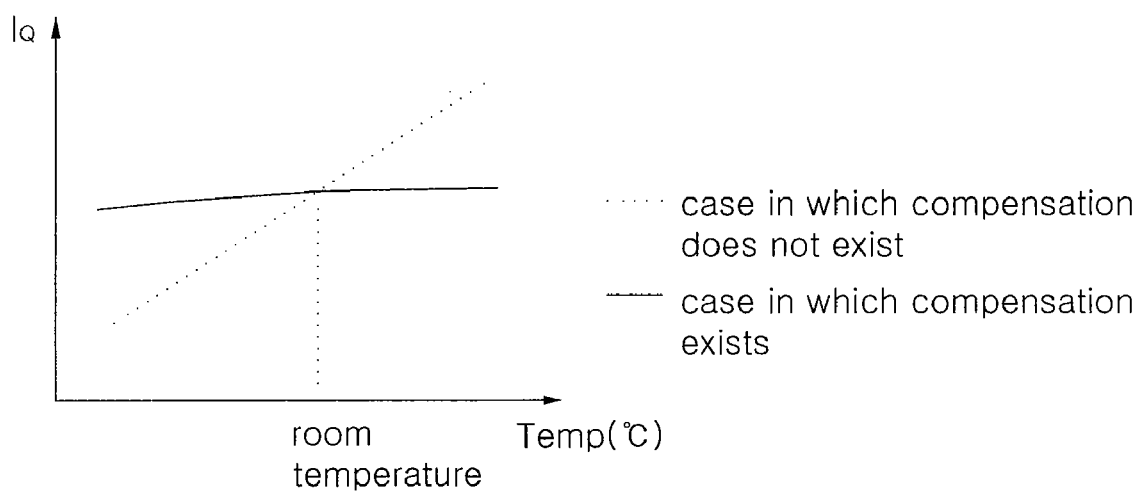
FIGS. 10 through 12 are graphs showing the operation modes of the temperature-compensated bias circuit for a power amplifier according to the present invention.
Figure 10B:
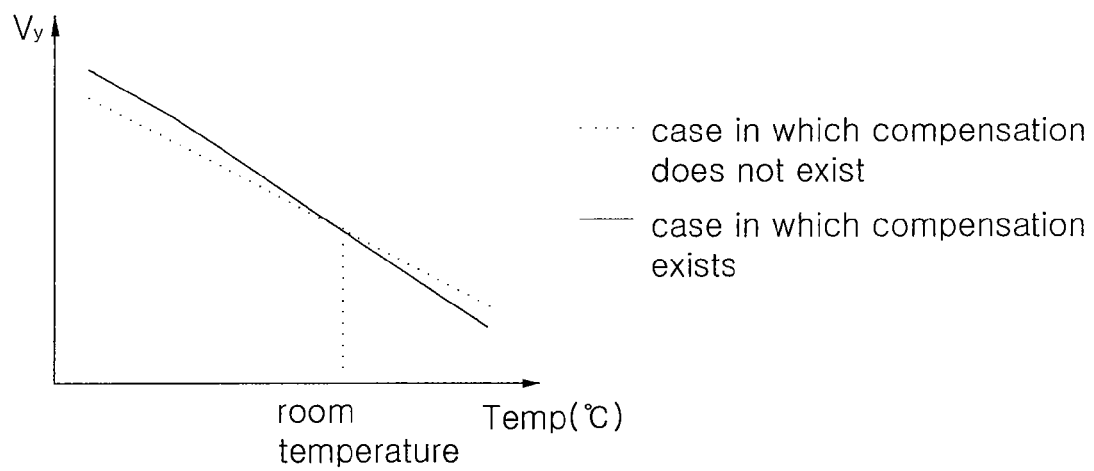

FIGS. 10A and 10B are graphs showing changes in the $I_Q$ and $V_y$ according to a change in temperature in the operation mode 1 (supply+absorption mode), respectively.

Figure 11A:
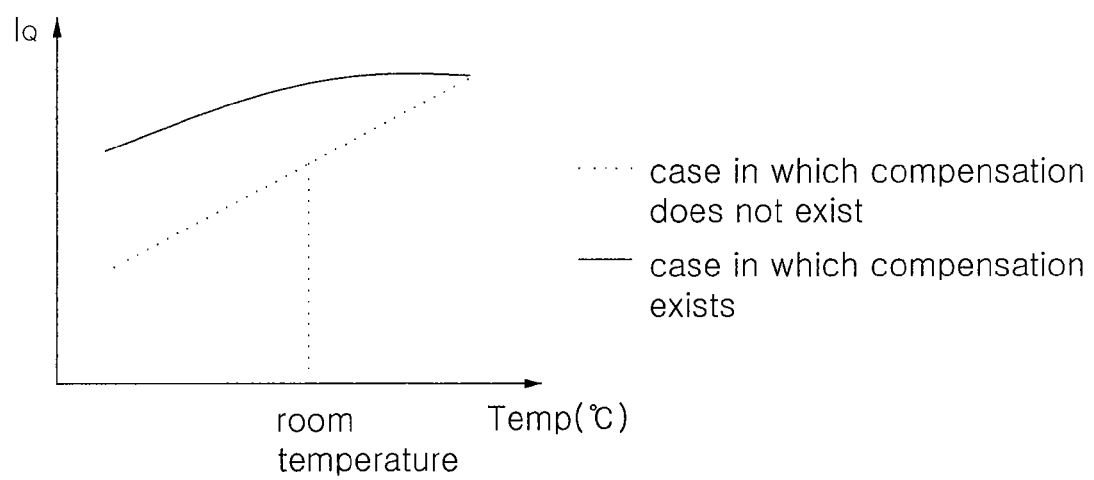
Figure 11B:
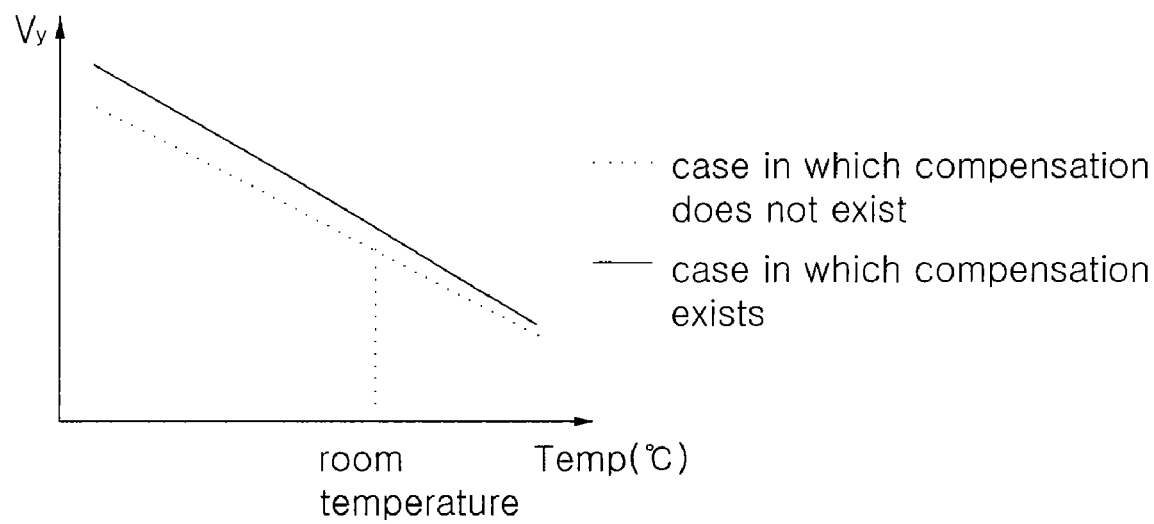

FIGS. 11A and 11B are graphs showing changes in the $I_Q$ and $V_y$ according to a change in temperature in the operation mode 2 (supply mode), respectively.

Figure 12A:
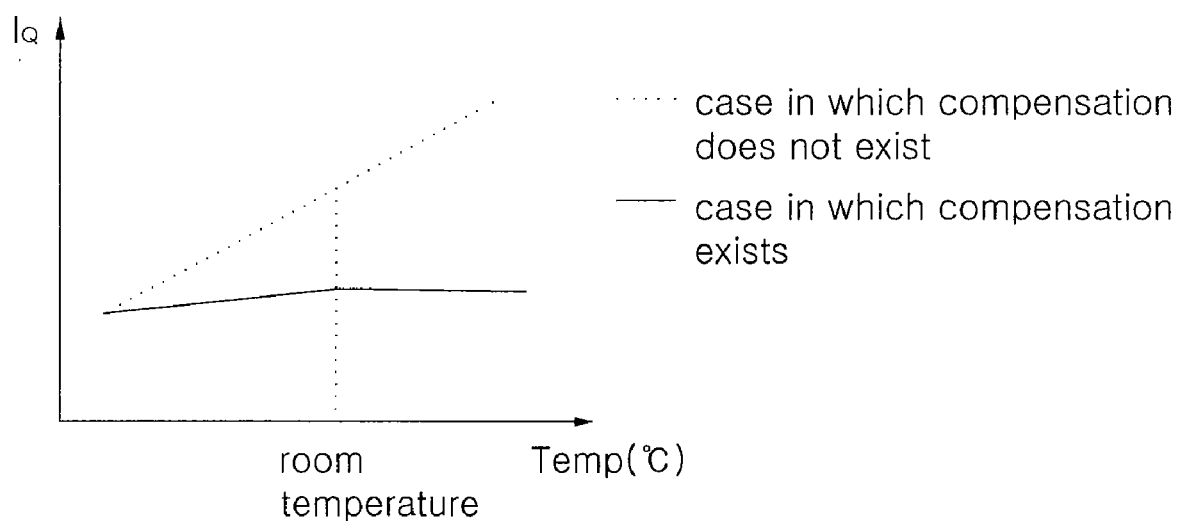
Figure 12B:
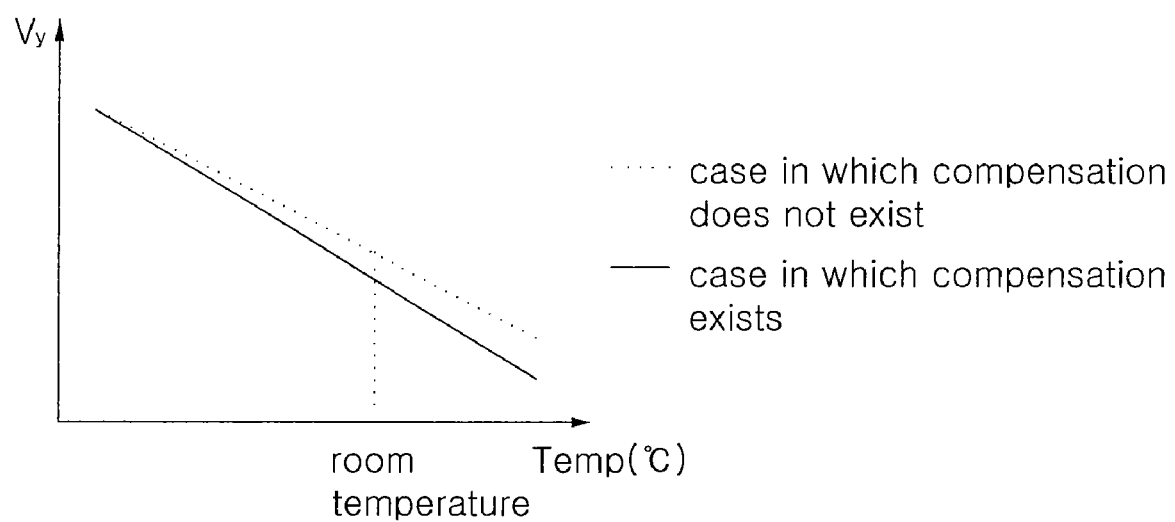

FIGS. 12A and 12B are graphs showing changes in the $I_Q$ and $V_y$ according to a change in temperature in the operation mode 3 (absorption mode), respectively.

While this invention has been particularly shown and described with reference to preferred embodiments thereof, it will be understood by those skilled in the art that various changes in form and details may be made therein without departing from the spirit and scope of the invention as defined by the appended claims.

As described above, according to the temperature-compensated bias circuit according to the present invention, in spite of a change in temperature, the static operation current of the power amplifier is maintained at the room temperature (Mode 1), the value of the static operational current $I_Q$ at the highest temperature is maintained within a range allowed by the specification (Mode 2), and the value of the static operational current $I_Q$ at the lowest temperature is constantly maintained within the range allowed by the specification (Mode 3). Thus, the linearity of the power amplifier is maintained and unnecessary power consumption due to the power amplifier is prevented.

Furthermore, a portable wireless communication apparatus having the power amplifier according to the present invention can maintain the optimal communication quality regardless of a surrounding temperature and have a longer talk time.

The embodiments of the present invention have been described above for purposes of illustrating the present invention. It is not intended to be exhaustive or to limit the invention to the precise form described. Many modifications and variations are possible in light of the teaching above. Accordingly, the scope of the invention is defined by the appended claims.

What is claimed is:

1. A temperature-compensated bias circuit for a power amplifier comprising:
   a first resistor (Rref) connected to a reference voltage is connected to a base terminal of a third transistor (Q3) and an emitter terminal of the third transistor is connected to a first diode (D1);
   a second resistor (R1) connected to the reference voltage;
   a third resistor (R2) connected to the second resistor in series;
   a fourth resistor (Rc) having one terminal connected to the reference voltage;
   a fifth resistor (Re) having one terminal connected to ground;
   a bias transistor (Q4) having a base terminal connected to a contact point (VS) between the second resistor and the third resistor, a collector terminal connected to the other terminal of the fourth resistor, and an emitter terminal connected to the other terminal of the fifth resistor; and
   a sixth resistor (Rf) connected between a collector terminal of the third transistor and a collector terminal of the bias transistor.

2. The temperature-compensated bias circuit of claim 1, wherein the voltage of the collector terminal of the bias transistor is determined by a voltage of the contact point between the second resistor and the third resistor.

3. The temperature-compensated bias circuit of claim 1, wherein the voltage of the collector terminal of the bias transistor is changed according to a value of the fourth resistor.

4. A temperature-compensated bias circuit for a power amplifier comprising:
   a first resistor (Rref) connected to a reference voltage is connected to a base terminal of a third transistor (Q3) and an emitter terminal of the third transistor is connected to a first diode (D1);
   a second diode (D2) connected to the reference voltage;
   a second resistor (R1) connected to the second diode;
   a third resistor (R2) connected to the second resistor in series;
   a fourth resistor (Rc) having one terminal connected to the reference voltage;
   a fifth resistor (Re) having one terminal connected to ground;
   a bias transistor (Q4) having a base terminal connected to a contact point (VS) between the second resistor and the third resistor, a collector terminal connected to the other terminal of the fourth resistor, and an emitter terminal connected to the other terminal of the fifth resistor; and
   a sixth resistor (Rf) connected between a collector terminal of the third transistor and the collector terminal of the bias transistor.

5. The temperature-compensated bias circuit of claim 4, wherein the voltage of the collector terminal of the bias transistor is determined by a voltage of the contact point between the second resistor and the third resistor.

6. The temperature-compensated bias circuit of claim 4, wherein the voltage of the collector terminal of the bias transistor is changed according to a value of the fourth resistor.

7. The temperature-compensated bias circuit of claim 2, wherein the second diode is disposed between the second resistor and the contact point.

8. A temperature-compensated bias circuit for a power amplifier comprising:
   a first resistor (Rref) connected to a reference voltage is connected to a base terminal of a third transistor (Q3) and an emitter terminal of the third transistor is connected to a first diode (D1);
   a second resistor (R1) connected to the reference voltage;
   a third resistor (R2) connected to the second resistor in series;
   a sixth resistor (Re) having one terminal connected to ground;
   a bias transistor (Q4) having a base terminal connected to a contact point (VS) between the second resistor and the third resistor and an emitter terminal connected to the other terminal of the sixth resistor; and
   a seventh resistor (Rf) connected between a collector terminal of the third transistor (Q3) and a collector terminal of the bias transistor.

9. The temperature-compensated bias circuit of claim 8, wherein the voltage of the collector terminal of the bias transistor is determined by a voltage of the contact point between the second resistor and the third resistor.

10. A temperature-compensated bias circuit for a power amplifier comprising:
    a first resistor (Rref) connected to a reference voltage is connected to a base terminal of a third transistor (Q3) and an emitter terminal of the third transistor is connected to a first diode (D1);
    a second diode (D2) connected to the reference voltage;
    a second resistor (R1) connected to the second diode;
    a third resistor (R2) connected to the second resistor in series;
    a sixth resistor (Re) having one terminal connected to ground;
    a bias transistor (Q4) having a base terminal connected to a contact point (VS) between the second resistor and the third resistor and an emitter terminal connected to the other terminal of the sixth resistor; and
    a seventh resistor (Rf) connected between a collector terminal of the third transistor (Q3) and a collector terminal of the bias transistor.

11. The temperature-compensated bias circuit of claim 10, wherein the voltage of the collector terminal of the bias transistor is determined by a voltage of the contact point between the second resistor and the third resistor.

12. The temperature-compensated bias circuit of claim 10, wherein the second diode is disposed between the second resistor and the contact point.

* * * * *